United States Patent
Leobandung

(10) Patent No.: US 9,472,651 B2
(45) Date of Patent: Oct. 18, 2016

(54) SPACERLESS FIN DEVICE WITH REDUCED PARASITIC RESISTANCE AND CAPACITANCE AND METHOD TO FABRICATE SAME

(71) Applicant: GlobalFoundries U.S. 2 LLC, Hopewell Junction, NY (US)

(72) Inventor: Effendi Leobandung, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 7 days.

(21) Appl. No.: 14/017,461

(22) Filed: Sep. 4, 2013

(65) Prior Publication Data

US 2015/0064854 A1    Mar. 5, 2015

(51) Int. Cl.

| | |
|---|---|
| H01L 29/78 | (2006.01) |
| H01L 21/36 | (2006.01) |
| H01L 29/66 | (2006.01) |
| H01L 27/12 | (2006.01) |
| H01L 21/84 | (2006.01) |
| H01L 29/417 | (2006.01) |

(52) U.S. Cl.
CPC ....... *H01L 29/66795* (2013.01); *H01L 21/845* (2013.01); *H01L 27/1211* (2013.01); *H01L 29/41791* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 6,245,624 B1 | 6/2001 | Kim et al. | |
| 6,265,253 B1 | 7/2001 | Lukanc et al. | |
| 6,297,132 B1 | 10/2001 | Zhang et al. | |
| 6,610,565 B2 | 8/2003 | Kim et al. | |
| 6,717,211 B2 | 4/2004 | Gonzalez et al. | |
| 8,269,276 B2 | 9/2012 | Guenther | |
| 2008/0135935 A1* | 6/2008 | Cho | H01L 21/845 257/347 |
| 2011/0284965 A1* | 11/2011 | Pillarisetty et al. | 257/365 |
| 2014/0001572 A1* | 1/2014 | Bohr et al. | 257/401 |
| 2014/0239395 A1* | 8/2014 | Basker et al. | 257/347 |
| 2015/0243745 A1* | 8/2015 | Kelly | H01L 29/41766 257/369 |

FOREIGN PATENT DOCUMENTS

KR    20000009491 A    2/2000

OTHER PUBLICATIONS

Notice of Allowance Communication, U.S. Appl. No. 14/027,331, Dated Feb. 4, 2016, pp. 1-14.
Office Action Communication, U.S. Appl. No. 14/027,331, pp. 1-10.

* cited by examiner

*Primary Examiner* — Pamela E Perkins
(74) *Attorney, Agent, or Firm* — David A. Cain, Esq.

(57) ABSTRACT

A structure includes a substrate having an insulator layer and a plurality of elongated semiconductor fin structures disposed on a surface of the insulator layer. The fin structures are disposed substantially parallel to one another. The structure further includes a plurality of elongated sacrificial gate structures each comprised of silicon nitride. The sacrificial gate structures are disposed substantially parallel to one another and orthogonal to the plurality of fin structures, where a portion of each of a plurality of adjacent fin structures is embedded within one of the sacrificial gate structures leaving other portions exposed between the sacrificial gate structures. The structure further includes a plurality of semiconductor source/drain (S/D) structures disposed over the exposed portions of the fin structures between the sacrificial gate structures. The embodiments eliminate a need to form a conventional spacer on the fin structures. A method to fabricate the structure is also disclosed.

18 Claims, 8 Drawing Sheets

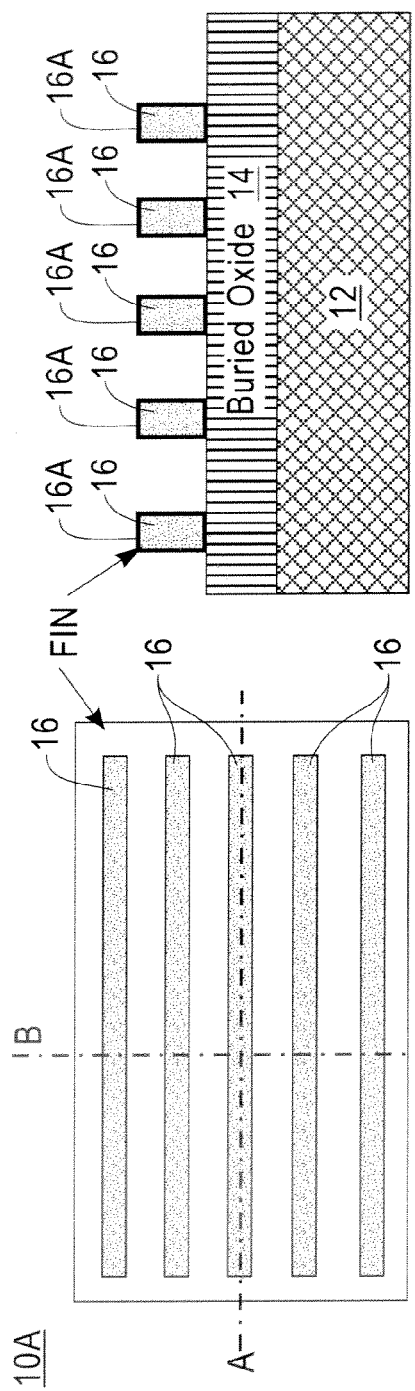
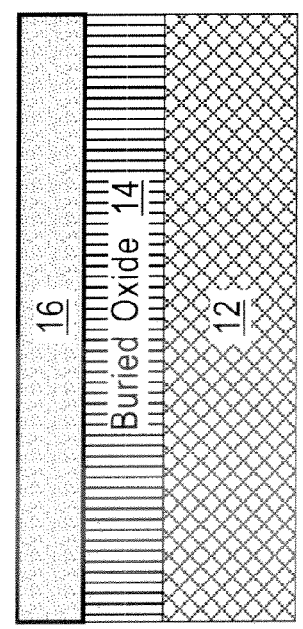
FIG. 1
FIG. 1A
FIG. 1B

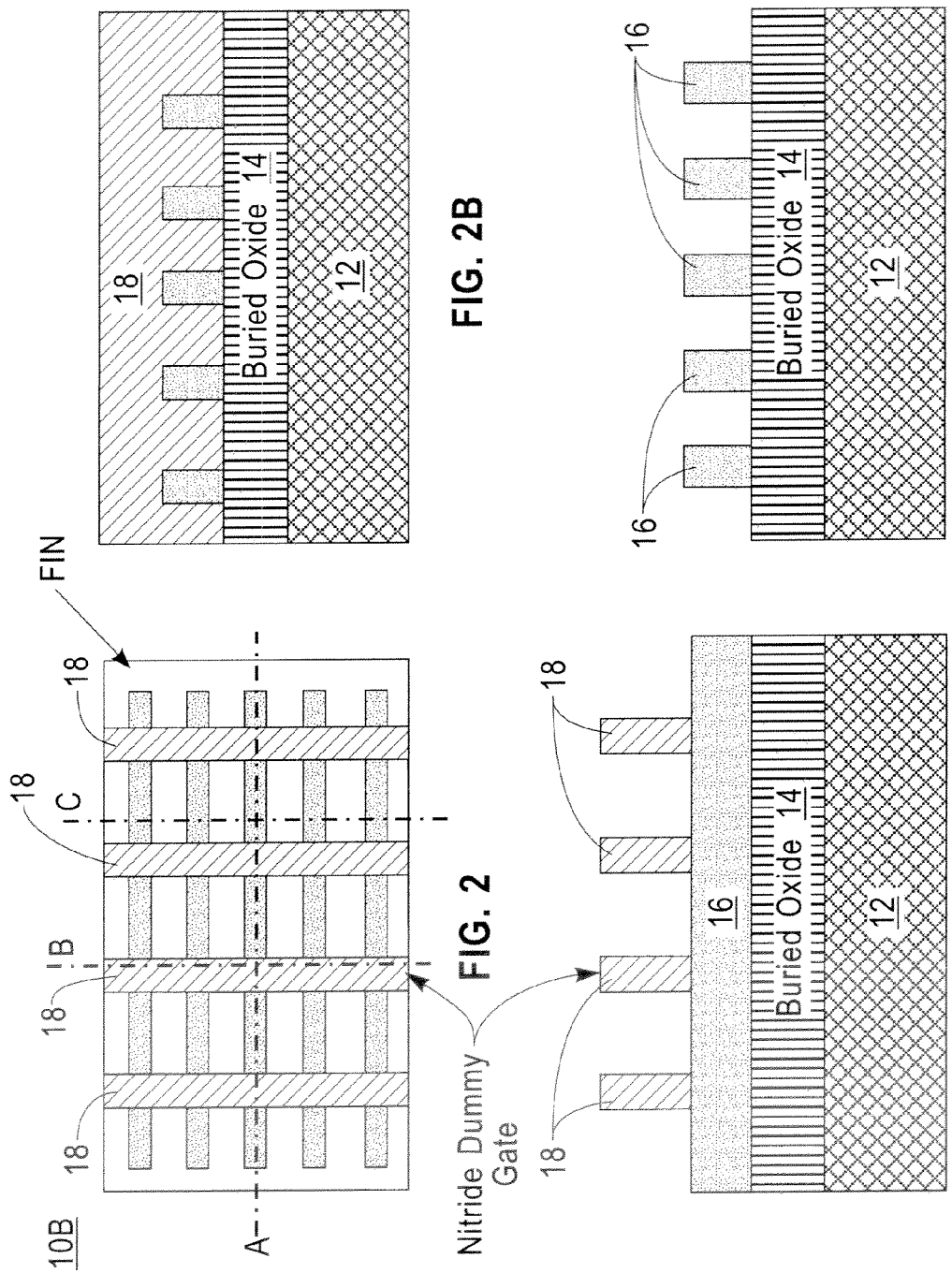

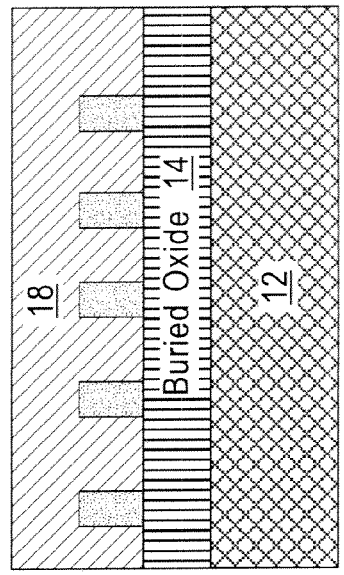
FIG. 3B
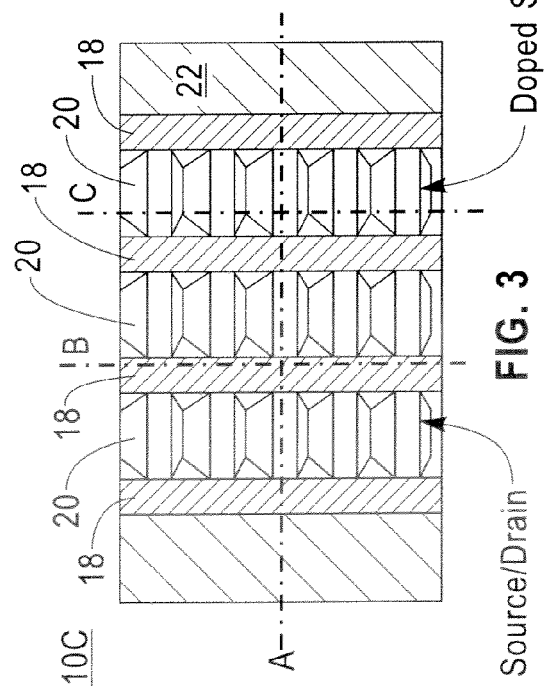
FIG. 3
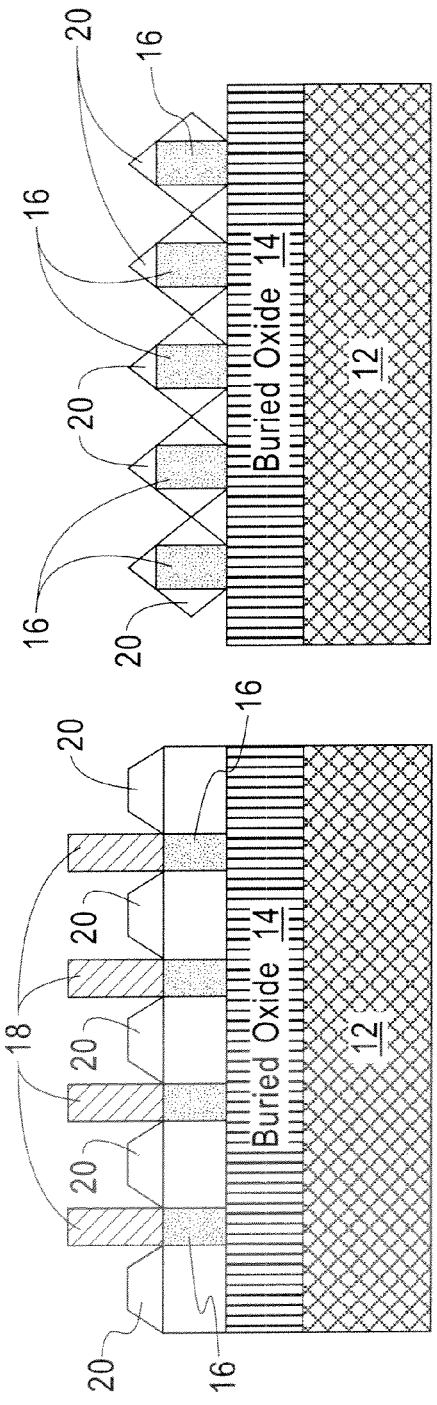
FIG. 3C
FIG. 3A

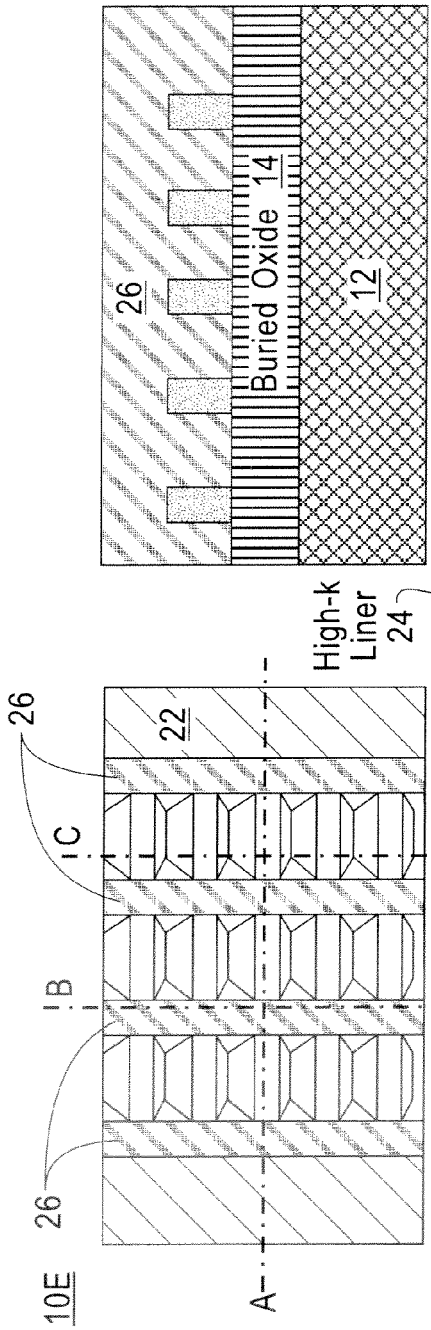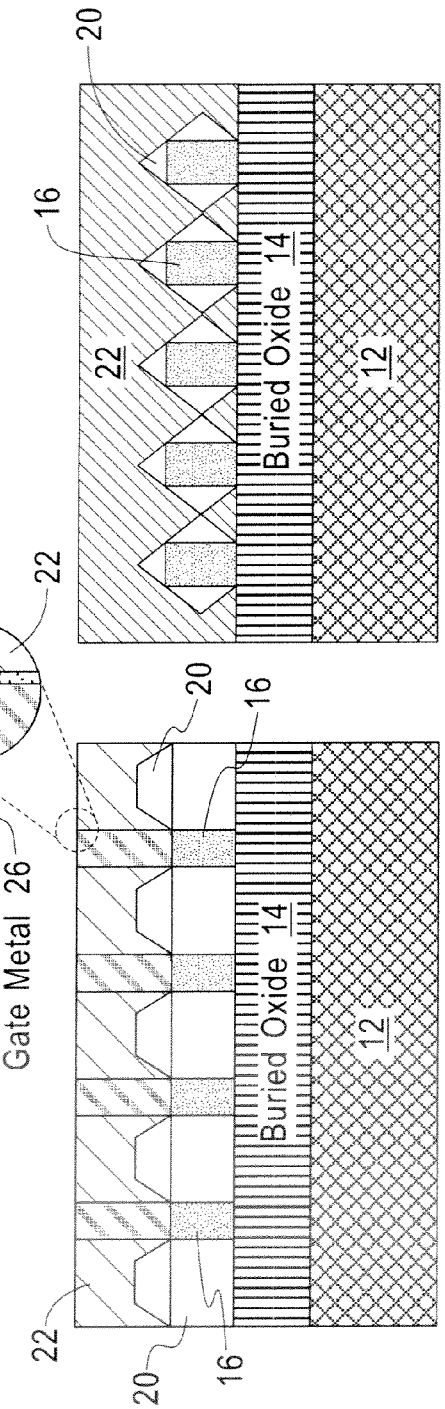

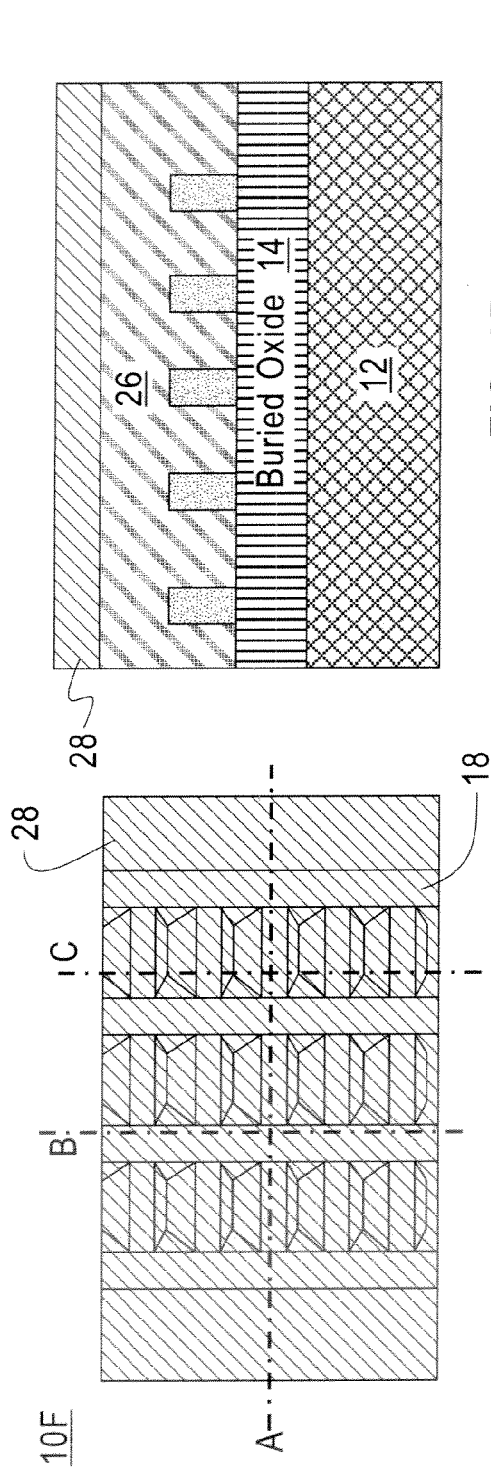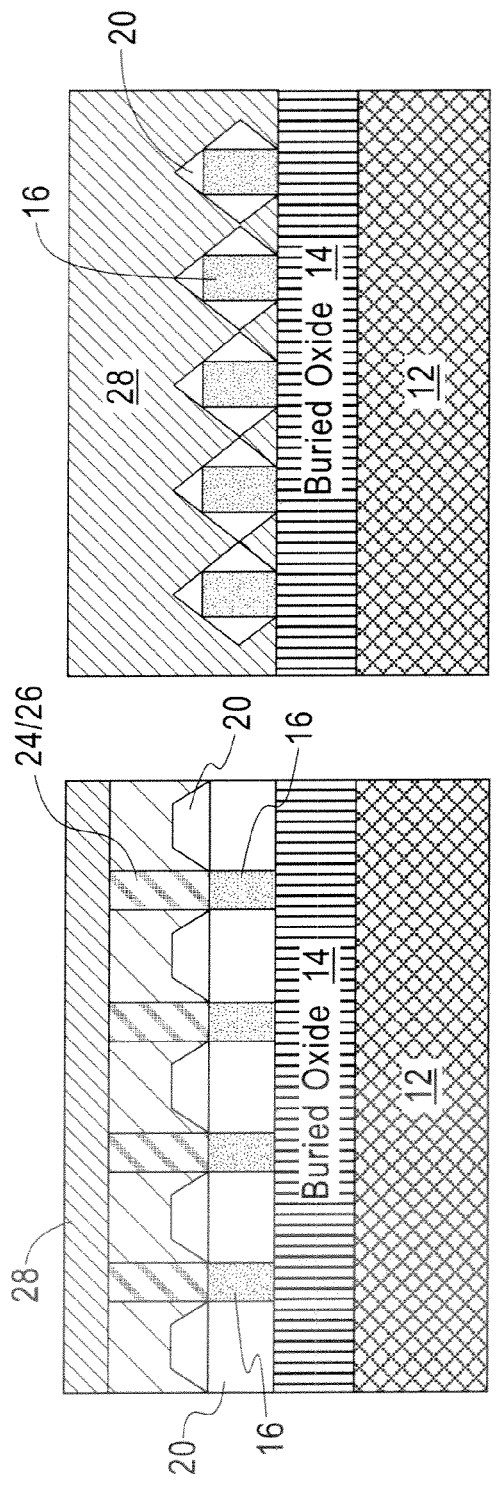

SPACERLESS FIN DEVICE WITH REDUCED PARASITIC RESISTANCE AND CAPACITANCE AND METHOD TO FABRICATE SAME

TECHNICAL FIELD

The exemplary embodiments of this invention relate generally to semiconductor devices and fabrication techniques and, more specifically, relate to the fabrication of semiconductor transistor devices, such as those used in random access memory (RAM) and logic circuitry, using a silicon on insulator (SOI) material.

BACKGROUND

In SOI technology a thin silicon layer is formed over an insulating layer, such as silicon oxide, which in turn is formed over a bulk substrate. This insulating layer is often referred to as a buried oxide (BOX) layer or simply as a BOX. For a single BOX SOI wafer the silicon layer can be divided into active regions by shallow trench isolation (STI) which intersects the BOX and provides total isolation for active device regions formed in the silicon layer. Sources and drains of field effect transistors (FETs) can be formed, for example, by the growth of in-situ doped silicon or by ion implantation of N-type and P-type dopant material into the silicon layer. A field effect transistor channel region between a source/drain pair can be created so as to underlie a gate structure using, for example, an elongated 'fin' structure that is defined in the silicon layer when a FinFET device is being fabricated.

One problem that can be present in a conventional FinFET device is the presence of a substantial amount of parasitic resistance and capacitance, both of which can detrimentally affect the device performance.

SUMMARY

In accordance with a first aspect of this invention there is provided a method to fabricate a device. The method comprises providing a substrate comprised of an insulator layer having a plurality of elongated semiconductor fin structures disposed on a surface of the insulator layer, the fin structures being disposed substantially parallel to one another. The method further comprises forming on the surface of the insulator layer a plurality of elongated sacrificial gate structures each comprised of silicon nitride. The sacrificial gate structures are disposed substantially parallel to one another and orthogonal to the plurality of fin structures. A portion of each of a plurality of adjacent fin structures is embedded within one of the sacrificial gate structures leaving other portions exposed between the sacrificial gate structures. The method further comprises epitaxially depositing a plurality of semiconductor source/drain (S/D) structures over the exposed portions of the fin structures between the sacrificial gate structures and forming a layer of oxide over the S/D structures. The method further comprises removing the sacrificial gate structures and replacing the removed sacrificial gate structures with gate structures each comprised of a layer of gate dielectric and gate metal. The method further comprises forming trenches parallel to and between the gate structures. The trenches extend through the layer of oxide and through an underlying portion of the S/D structures to the surface of the insulator layer. The method further comprises forming S/D contacts in the trenches.

In accordance with another aspect of this invention there is provided a structure that comprises a substrate comprised of an insulator layer having a plurality of elongated semiconductor fin structures disposed on a surface of the insulator layer, the fin structures being disposed substantially parallel to one another. The structure further comprises a plurality of elongated sacrificial gate structures each comprised of silicon nitride. The sacrificial gate structures are disposed substantially parallel to one another and orthogonal to the plurality of fin structures, where a portion of each of a plurality of adjacent fin structures is embedded within one of the sacrificial gate structures leaving other portions exposed between the sacrificial gate structures. The structure further includes a plurality of semiconductor source/drain (S/D) structures disposed over the exposed portions of the fin structures between the sacrificial gate structures.

In accordance with yet another aspect of this invention there is provided a structure that comprises a substrate comprised of an insulator layer having a plurality of elongated semiconductor fin structures disposed on a surface of the insulator layer, the fin structures being disposed substantially parallel to one another. The structure further includes a plurality of elongated gate structures each comprised of gate dielectric and gate metal. The gate structures are disposed substantially parallel to one another and orthogonal to the plurality of fin structures, where a portion of each of a plurality of adjacent fin structures is embedded within one of the gate structures leaving other portions exposed between the gate structures. The structure further includes a plurality of semiconductor source/drain (S/D) structures over the exposed portions of the fin structures between the gate structures and a layer of oxide over the S/D structures and between the elongated gate structures. The elongated gate structures are embedded in the layer of oxide. The structure further includes a plurality of elongated S/D contacts disposed between and parallel to the elongated gate structures. The S/D contacts are embedded in the layer of oxide and extend through the layer of oxide and through an underlying portion of the S/D structures to the surface of the insulator layer. In the structure a portion of the layer of oxide is disposed between a S/D contact and an adjacent gate structure.

BRIEF DESCRIPTION OF THE SEVERAL VIEWS OF THE DRAWINGS

FIGS. 1-8 are each an enlarged top view of a structure showing various processing stages or steps that are performed in accordance with embodiments of this invention. FIG. 1A and FIG. 1B are cross-sectional views taken through the structure along section lines in FIG. 1 labeled A and B, respectively, while FIGS. 2A-2C through FIGS. 8A-8C are cross-sectional views taken through the structure along section lines in FIGS. 2-8 labeled A, B and C, respectively.

More specifically, FIG. 1 shows the structure after patterning of a plurality of fins;

FIG. 2 shows the structure after the patterning of a replacement (dummy) gate nitride;

FIG. 3 shows the structure after the selective epitaxial growth of faceted source/drains (S/Ds);

FIG. 4 shows the structure after a layer of oxide is deposited and planarized;

FIG. 5 shows the structure after the dummy gate nitride of FIG. 2 is replaced with a gate dielectric and gate metal;

FIG. 6 shows the structure after it is covered with an insulator;

FIG. 7 shows the structure after patterning and etching S/D contact holes; and

FIG. 8 shows the structure after deposition of a contact hole liner and contact metal.

DETAILED DESCRIPTION

Figure 4B:
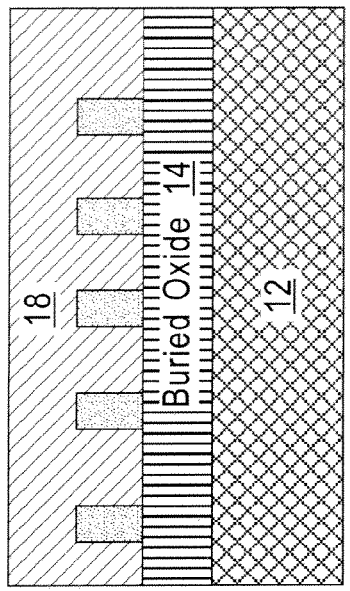
Figure 4C:
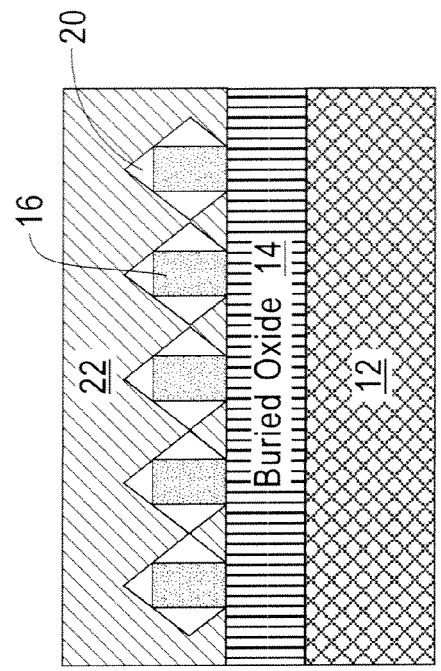
Figure 4:
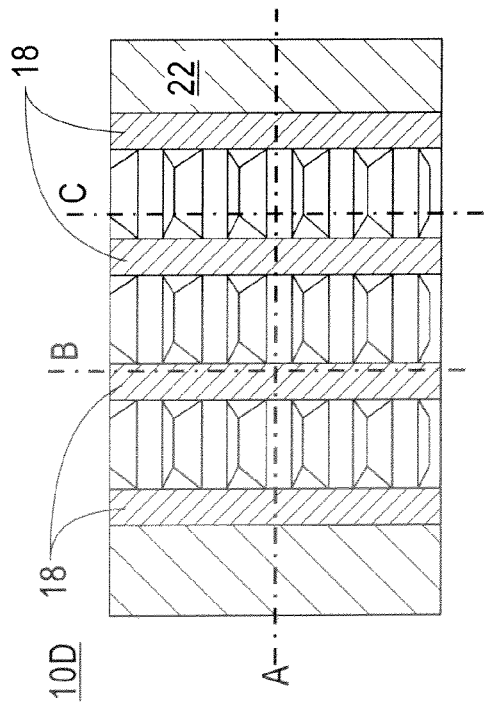
Figure 4A:
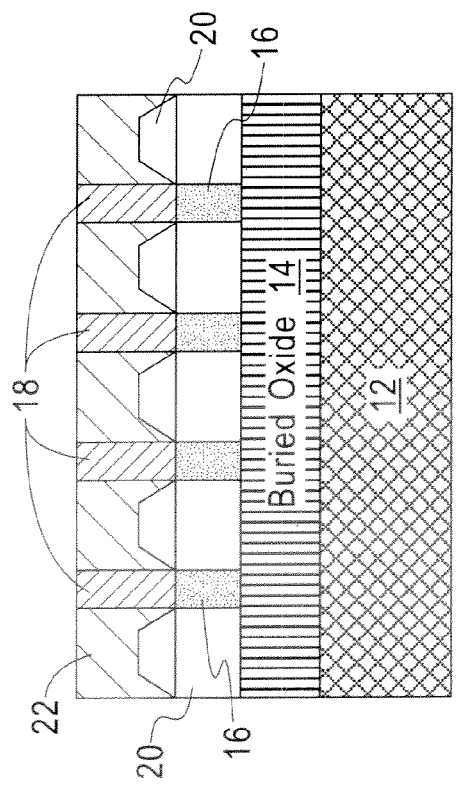
Figure 7B:
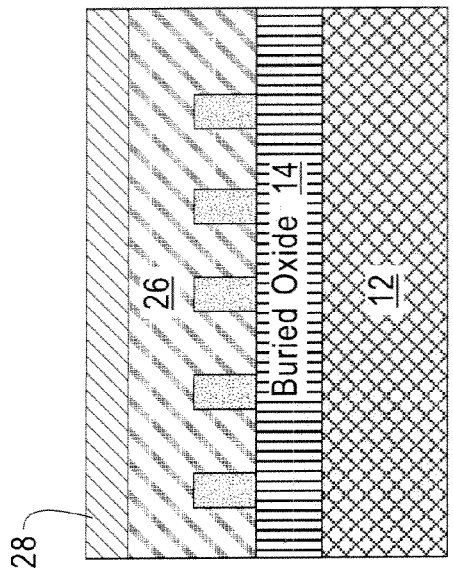
Figure 7C:
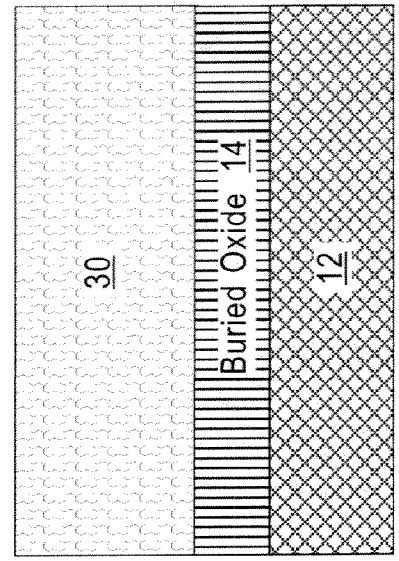
Figure 7:
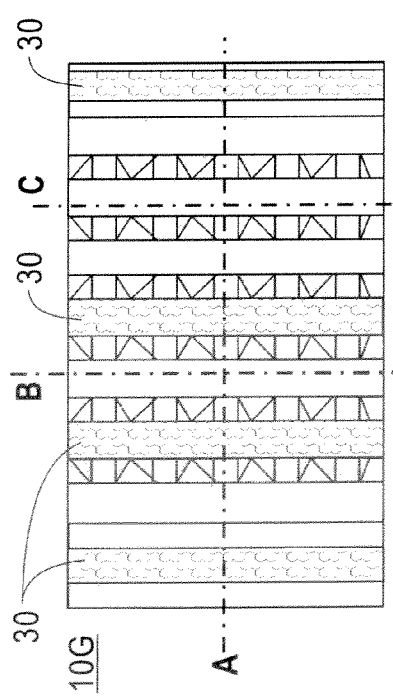
Figure 7A:
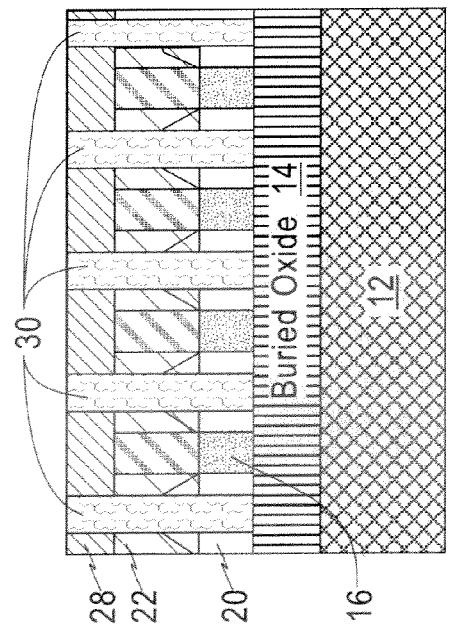

Described below is a replacement gate process for forming a multi-fin FinFET device that can be characterized as being 'spacerless', i.e., there is no need to form a spacer around a gate stack or sacrificial gate stack precursor structure as in conventional practice.

FIGS. 1, 1A and 1B shows a portion of a structure, a wafer structure, also referred to as a first intermediate structure 10A that is comprised of a substrate 12 having an overlying layer of insulator or BOX 14. The substrate 12 can be formed from any suitable supporting material such as bulk silicon and can have any desired thickness. The BOX 14 can be formed from silicon oxide ($SiO_2$) and can have a thickness in a range of, for example, about 100 nm or less to about 200 nm or more, with 150 nm being one suitable and typical thickness. In FIGS. 1, 1A and 1B it can be seen that a silicon-on-insulator layer that overlies the BOX 14 has been patterned and etched to form a plurality of fins 16. Each fin 16 can have a height measured from the top surface of the BOX 14 of, for example, about 30 nm and a width in a range of about, for example, 5 nm to about 15 nm. A thin layer (e.g., thickness about 1 nm-2 nm) of a protective oxide ($SiO_2$) 16A can be formed on exposed surfaces of the fins 16. The fins 16 can be substantially parallel to one another and substantially equally spaced apart, although this is not a requirement.

Note that while the example shown in FIGS. 1 and 1B depicts the presence of five fins 16, in practice there can be many more than five fins present on a typical integrated circuit wafer embodiment.

FIGS. 2 and 2A-2C show a second intermediate structure 10B after patterning and the deposition of sacrificial replacement (dummy or precursor) gate nitride structures 18. The nitride structures 18 can be formed from silicon nitride ($Si_3N_4$) and can have a height (measured from the top surface of the fins 16) of about 50 nm and an exemplary width in a range of about 15 nm to about 35 nm. The dimensions of the nitride structures 18 substantially define the dimensions of the actual metal gate structures that are formed subsequently (see FIG. 5). The nitride structures 18 are elongated structures that are parallel to one another and are formed to run orthogonal to the fins 16 and to cross over and partially embed a portion of a plurality of adjacent fins 16 (as can be most clearly seen in FIG. 2B).

It can be noted that in conventional practice sacrificial replacement (dummy) gate structures are typically formed from, for example, amorphous silicon (a-Si) or polysilicon and not from silicon nitride as in this invention.

FIGS. 3 and 3A-3C show a third intermediate structure 10C after the selective epitaxial growth (e.g., using VPE or LPE or MBE or any suitable epitaxial growth procedure) of faceted source/drains (S/Ds) 20 over the fins 16 and between the gate nitride structures 18. It can be noted that the S/Ds 20 are grown without requiring a spacer (e.g., a $SiO_2$ spacer) to be formed around the dummy gate structures 18 since the dummy gate structures 18 are themselves composed of silicon nitride. The S/Ds 20 can be formed from in-situ doped silicon (e.g., doped with phosphorus (P) for an NFET and doped with boron (B) for a PFET) and masks can be selectively applied and removed so as to deposit the P-type S/Ds followed by the N-type S/Ds (or vice versa). The S/D doping concentration can be about $10^{20}$ atoms/cm$^3$ and the dopants can be diffused and activated by the use of a flash (millisecond) anneal (e.g., 1200° C.). The S/Ds 20 can have an exemplary thickness of about 20 nm measured from the top surface of the BOX 14. Other suitable types of N-type and P-type dopants can be used.

Note that in some less preferred embodiments the S/Ds 20 could be epitaxially grown from substantially intrinsic silicon and then implanted with suitable P-type and N-type dopants.

The faceted irregular shape of the S/Ds 20 is largely a result of the crystal orientation preferred epitaxial growth of the silicon. However a non-preferred crystal orientation epitaxy can also be employed to minimize or eliminate the facets.

The two centrally located replacement gate structures 18 will eventually define two adjacent active transistor devices, while the two replacement gate structures at the far left and the far right are associated with what will be "dummy", non-functional devices.

FIGS. 4 and 4A-4C show a fourth intermediate structure 10D after a layer 22 of oxide, e.g., $SiO_2$, is deposited and planarized down to the top surfaces of the sacrificial replacement gate nitride structures 18, resulting in a final thickness of the oxide layer 22 being about equal to the height of the replacement gate nitride structures 18 or, in this non-limiting embodiment, about 50 nm. A chemical-mechanical polish (CMP) procedure is one suitable technique to planarize the oxide layer 22. Note that in FIG. 4 the underlying S/Ds 20 would not actually be visible from the top surface of the structure 10 at this point in the fabrication process as they would be covered by the oxide layer 22. It can also be noted that at this point the sacrificial replacement gate nitride structures 18 and the S/Ds 20 are embedded in the oxide layer 22.

FIGS. 5 and 5A-5C show a fifth intermediate structure 10E after the dummy gate nitride 18 that was deposited in FIG. 2 is replaced with a gate structure comprised of a gate dielectric (liner) 24 and gate metal 26. A wet chemical etch using, for example, phosphoric acid ($H_3PO_4$) can be used to remove the dummy gate nitride 18. A layer of the gate dielectric 24, for example a layer of high dielectric constant (high-k) material, is then deposited into the openings followed by the deposition of a selected gate metal or metals 26. The high-k liner 24 and gate metal 26 is shown more clearly in the partial enlarged view depicted in FIG. 5A.

In general the high-k material can comprise a dielectric metal oxide having a dielectric constant that is greater than the dielectric constant of silicon nitride (7.5). The high-k dielectric layer 24 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 24 may be from about 1 nm to about 10 nm, and more preferably from about 1.5 nm to about 3 nm. The high-k dielectric layer 24 can have an effective oxide thickness (EOT) on the order of, or less than, about 1 nm. The gate metal 26 can be deposited directly on the surface of the high-k dielectric layer 24 by, for example, chemical vapor deposition (CVD), physical vapor deposition (PVD), or atomic layer deposition (ALD). As non-limiting examples the gate metal 26 can include a metal system selected from one or more of TiN, TiC, TaN, TaC, TaSiN, HfN, W, Al and Ru.

FIG. 6 and FIGS. 6A-6C show a sixth intermediate structure 1 OF after it is covered with an insulator layer 28, such as a middle-of-line (MOL) insulator such as $SiO_2$. A thickness of the insulator layer 28 may be, for example, about 20 nm.

FIG. 7 and FIGS. 7A-7C show a seventh intermediate structure 10G after patterning and etching S/D contact apertures or holes (trenches) 30 between and parallel to the gate structures. The etch can be a multi-step etch that first etches the oxide layers 28 and 22 and that then etches an underlying portion of the silicon of the S/Ds 20 down to the top surface of the BOX 14. The width of the S/D contact openings 30 can be, for example, about 10 nm assuming as a non-limiting example a gate pitch of about 45 nm and a gate width of about 15 nm.

FIG. 8 and FIGS. 8A-8C show an eighth intermediate structure 10H after deposition of a S/D contact hole liner 32, such as titanium (Ti) or TiN, and a S/D contact 34, such as tungsten (W). Assuming an aspect ratio of about 1:5 for the S/D contact openings 30 the openings are readily fillable by TiN and W. The S/D contacts can be deposited by, for example, chemical vapor deposition (CVD) or by atomic layer deposition (ALD).

Note at this point that the gate structures and the S/D contacts are substantially embedded in the oxide layer 22.

Processing can continue to form gate contacts where needed.

Figure 8:
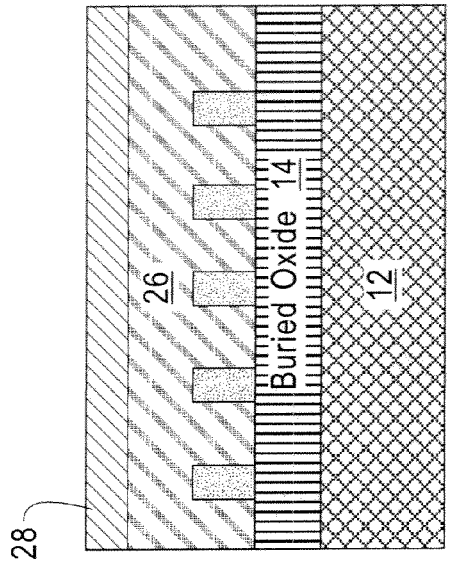
Figure 8B:
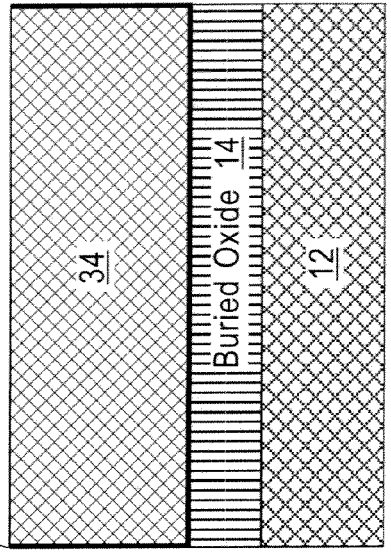

As can be seen in FIG. 8 there are three functional S/D contacts formed labeled as 1, 2 and 3. Between S/D contacts 1 and 2 is a first multi-fin FET and between S/D contacts 2 and 3 is a second multi-fin FET. The S/D contact 2 is thus common to both multi-fin FETs. As but one example the S/Ds 20 underlying the S/D contact 1 can function as a drain for the first multi-fin FET and are biased during operation via the S/D contact 1 to some positive or negative potential, the S/Ds 20 underlying the S/D contact 2 can function as a common source for both the first and second multi-fin FETs and are biased during operation to some common potential (e.g., circuit ground) via the S/D contact 2, and the S/Ds 20 underlying the S/D contact 3 can function as a drain for the second multi-fin FET and are biased during operation via the S/D contact 2 to some positive or negative potential (which could be the same potential applied to the S/D contact 1).

Figure 8A:
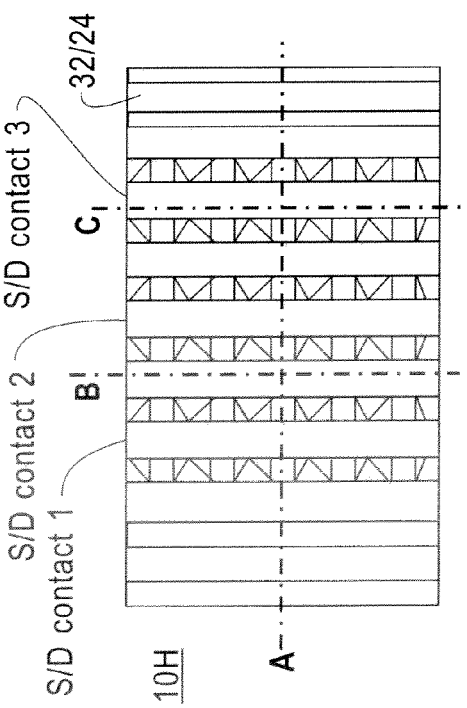
Figure 8C:
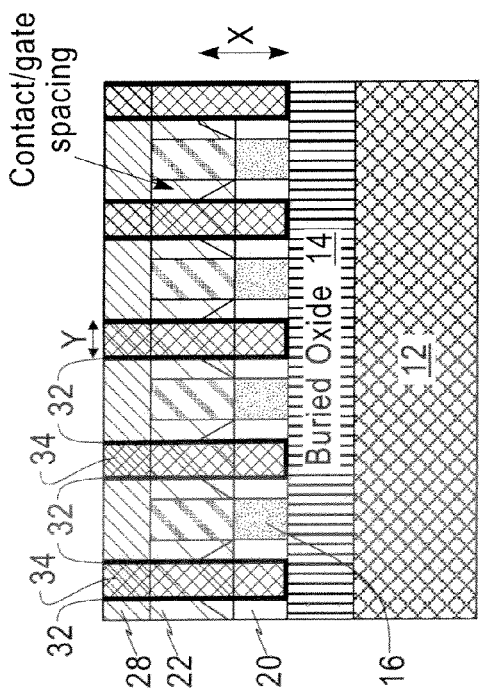

In FIG. 8A it can be seen that the S/D contact area (X) is independent of gate pitch since it is vertical and depends only on the height of the fin 16 versus the typical dimension (Y) that does depend on gate pitch. The increased contact area that is made possible serves to reduce the associated resistance between the fin 16 and the S/Ds 20.

Further, there is a low value of parasitic capacitance between the gate 26 and the S/D contact 34 since the intervening material is an oxide, e.g., $SiO_2$ having a dielectric constant of 3.9, as opposed to a conventional nitride gate spacer having a larger dielectric constant value. The use of these embodiments thus eliminates the need to form a conventional spacer on the fin 16 which can be a difficult process to perform reliably and uniformly. As a result the structure and process can be characterized as being a "spacerless" structure and process.

Further, the use of this process eliminates the troublesome epitaxial "mouse ear" that can occur due to epitaxial silicon grown on a conventional polysilicon dummy gate structure during S/D formation. This is avoided because the conventional polysilicon dummy gate structure is replaced by the silicon nitride dummy gate structure 18.

Assuming by example the value of 45 nm for the gate pitch, the gate width of 15 nm and the width of the contact 34 of 10 nm, the misalignment margin is about 10 nm on each side, a value significantly greater than typical modern tool misalignment specifications.

It is pointed out that certain aspects and embodiments of this invention can be employed with other than SOI substrates, such as with bulk substrates.

It is to be understood that although the exemplary embodiments discussed above with reference to FIGS. 1-8 can be used on common variants of the FET device including, e.g., FET devices with multi-fingered FIN and/or gate structures and FET devices of varying gate width and length, and can also be used with nanowire type devices.

Integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. A method to fabricate a device, comprising:
providing a substrate comprised of an insulator layer having a plurality of elongated semiconductor fin structures disposed on a surface of the insulator layer, the fin structures being disposed substantially parallel to one another;
forming on the surface of the insulator layer a plurality of elongated sacrificial gate structures each comprised of silicon nitride, the sacrificial gate structures being disposed substantially parallel to one another and orthogonal to the fin structures, where a portion of each of a plurality of adjacent fin structures is embedded within one of the sacrificial gate structures leaving other portions exposed between the sacrificial gate structures;
epitaxially depositing a plurality of semiconductor source/drain (S/D) structures over exposed portions of the fin structures between the sacrificial gate structures, the S/D structures having a faceted shape with bottom edges adjacent to the sacrificial gate structures and angled sidewalls extending upwards away from the sacrificial gate structures such that the angled sidewalls of the S/D structures are physically separated from the sacrificial gate structures by spaces;
forming a layer of oxide over the S/D structures, wherein portions of the layer of oxide completely fill each space that extends laterally between an angled sidewall of a S/D structure and an adjacent sacrificial gate structure;
removing the sacrificial gate structures and replacing the removed sacrificial gate structures with gate structures each comprised of a layer of gate dielectric and gate metal;
forming trenches parallel to and between the gate structures, the trenches extending through the layer of oxide and through an underlying portion of the S/D structures and fin structures to the surface of the insulator layer thereby separating an underlying portion of a given one of the S/D structure and fin structure and forming an opening in the S/D structure and fin structure between two opposing ends of the separated S/D structure and fin structure; and
forming S/D contacts in the trenches so as to contact, for the given one of the S/D contacts, the two opposing ends of the separated S/D structure and fin structure, wherein additional portions of the layer of oxide are disposed between and in contact with the S/D contacts and the gate structures.

2. The method as in claim 1, where the step of forming trenches comprises an initial step of applying a layer of insulator over the layer of oxide and over the gate structures, and where the trenches also extend through the layer of insulator.

3. The method as in claim 1, where the step of epitaxially depositing the plurality of semiconductor source/drain (S/D) structures epitaxially deposits in-situ doped silicon over the exposed portions of the fin structures between the sacrificial gate structures.

4. The method as in claim 3, further comprising performing a rapid anneal process on the in-situ doped silicon.

5. The method as in claim 1, where forming the layer of oxide over the S/D structures comprises planarizing the layer of oxide and exposing a top surface of each of the sacrificial gate structures.

6. The method as in claim 1, where the layer of gate dielectric is a comprised of a high dielectric constant (high-k) material.

7. The method as in claim 1, where the layer of oxide is comprised of $SiO_2$ and forms a material that is present between and in contact with a S/D contact and an adjacent gate structure.

8. A method to fabricate a device, comprising:
providing a substrate comprised of an insulator layer having a plurality of elongated semiconductor fin structures disposed on a surface of the insulator layer, the fin structures being disposed substantially parallel to one another;
forming on the surface of the insulator layer a plurality of elongated sacrificial gate structures each comprised of silicon nitride, the sacrificial gate structures being disposed substantially parallel to one another and orthogonal to the fin structures, where a portion of each of a plurality of adjacent fin structures is embedded within one of the sacrificial gate structures leaving other portions exposed between the sacrificial gate structures;
epitaxially depositing a plurality of semiconductor source/drain (S/D) structures over exposed portions of the fin structures between the sacrificial gate structures, where the step of epitaxially depositing the plurality of semiconductor source/drain (S/D) structures epitaxially deposits in-situ doped silicon over the exposed portions of the fin structures between the sacrificial gate structures and the semiconductor S/D structures have a faceted shape with bottom edges adjacent to the sacrificial gate structures and angled sidewalls extending upwards away from the sacrificial gate structures such that the angled sidewalls of the S/D structures are physically separated from the gate structures by spaces;
performing a rapid anneal process on the in-situ doped silicon; and
forming a layer of oxide over the S/D structures, wherein portions of the layer of oxide completely fill each space that extends laterally between an angled sidewall of a S/D structure and an adjacent sacrificial gate structure.

9. The method as in claim 8, further comprising:
removing the sacrificial gate structures and replacing the removed sacrificial gate structures with gate structures each comprised of a layer of gate dielectric and gate metal.

10. The method as in claim 9, further comprising:
forming trenches parallel to and between the gate structures, the trenches extending through the layer of oxide and through an underlying portion of the S/D structures to the surface of the insulator layer; and
forming S/D contacts in the trenches.

11. The method as in claim 10, where the step of forming trenches comprises an initial step of applying a layer of insulator over the layer of oxide and over the gate structures, and where the trenches also extend through the layer of insulator.

12. The method as in claim 9, where forming the layer of oxide over the S/D structures comprises planarizing the layer of oxide and exposing a top surface of each of the sacrificial gate structures.

13. The method as in claim 9, where the layer of gate dielectric is a comprised of a high dielectric constant (high-k) material.

14. The method as in claim 10, where the layer of oxide is comprised of SiO$_2$ and forms a material that is present between and in contact with a S/D contact and an adjacent gate structure.

15. A method to fabricate a device, comprising:
providing a substrate comprised of an insulator layer having a plurality of elongated semiconductor fin structures disposed on a surface of the insulator layer, the fin structures being disposed substantially parallel to one another;
forming on the surface of the insulator layer a plurality of elongated sacrificial gate structures, the sacrificial gate structures being disposed substantially parallel to one another and orthogonal to the fin structures, where a portion of each of a plurality of adjacent fin structures is embedded within one of the sacrificial gate structures leaving other portions exposed between the sacrificial gate structures;
forming a plurality of source/drain (S/D) structures over exposed portions of the fin structures between the sacrificial gate structures, the S/D structures having a faceted shape with bottom edges adjacent to the sacrificial gate structures and angled sidewalls extending upwards away from the sacrificial gate structures such that the angled sidewalls of the S/D structures are physically separated from the sacrificial gate structures by spaces;
forming a layer of dielectric material over the S/D structures, wherein portions of the layer of dielectric material completely fill each space that extends laterally between an angled sidewall of a S/D structure and an adjacent sacrificial gate structure;
removing the sacrificial gate structures and replacing the removed sacrificial gate structures with gate structures each comprised of a layer of gate dielectric and a gate conductor;
forming trenches parallel to and between the gate structures, the trenches extending through the layer of dielectric material and through an underlying portion of the S/D structures to the surface of the insulator layer thereby separating an underlying portion of a given one of the S/D structure and fin structure and forming an opening in the S/D structure and fin structure between two opposing ends of the separated S/D structure and fin structure; and
forming S/D electrically conductive contacts in the trenches so as to contact the two opposing ends of the separated S/D structure and fin structure, wherein additional portions of the layer of dielectric material disposed between and in contact with the S/D electrically conductive contacts and the gate structures.

16. The method as in claim 15, where the elongated sacrificial gate structures are each comprised of silicon nitride.

17. The method as in claim 15, where the gate structures and the S/D contacts are embedded in and surrounded by the dielectric layer, where the dielectric layer is comprised of an oxide, and where the oxide has a dielectric constant of less than 4.

18. The method as in claim 15, where the step of forming the S/D structures comprises epitaxially depositing in-situ doped silicon over the exposed portions of the fin structures between the sacrificial gate structures; and
the method further comprises performing a rapid anneal process on the in-situ doped silicon.

* * * * *